United States Patent
Lou et al.

(10) Patent No.: US 10,830,821 B2
(45) Date of Patent: Nov. 10, 2020

(54) METHODS AND APPARATUS FOR BATTERY POWER AND ENERGY AVAILABILITY PREDICTION

(71) Applicant: Apple Inc., Cupertino, CA (US)

(72) Inventors: Yiming Lou, Cupertino, CA (US); Soundararajan Manthiri, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 1249 days.

(21) Appl. No.: 14/605,914

(22) Filed: Jan. 26, 2015

(65) Prior Publication Data

US 2015/0316618 A1 Nov. 5, 2015

Related U.S. Application Data

(60) Provisional application No. 62/009,855, filed on Jun. 9, 2014, provisional application No. 61/988,823, filed on May 5, 2014.

(51) Int. Cl.
| | |
|---|---|
| *H02J 7/00* | (2006.01) |
| *H02J 9/00* | (2006.01) |
| *G06F 17/40* | (2006.01) |
| *G06F 19/00* | (2018.01) |
| *G01R 31/36* | (2020.01) |
| *G01R 31/367* | (2019.01) |
| *G01R 31/387* | (2019.01) |

(52) U.S. Cl.
CPC ....... *G01R 31/3647* (2019.01); *G01R 31/367* (2019.01); *G01R 31/3648* (2013.01); *G01R 31/387* (2019.01); *G06F 17/40* (2013.01); *G06F 19/00* (2013.01); *H02J 7/00* (2013.01); *H02J 9/00* (2013.01)

(58) Field of Classification Search
None
See application file for complete search history.

(56) References Cited

U.S. PATENT DOCUMENTS

| | | | |
|---|---|---|---|
| 9,071,082 B2 * | 6/2015 | Nishibayashi | H02J 3/32 |
| 9,091,735 B2 * | 7/2015 | Wang | G01R 31/3651 |
| 9,368,970 B2 * | 6/2016 | Nishibayashi | H02J 3/32 |
| 9,989,595 B1 * | 6/2018 | Wang | G01R 31/387 |

(Continued)

*Primary Examiner* — Ricky Ngon
(74) *Attorney, Agent, or Firm* — Kilpatrick Townsend and Stockton LLP

(57) ABSTRACT

This application relates to methods and apparatus for predicting power and energy availability of a battery. The prediction is made based on a given amount of time, which represents a period in which the battery may be required to operate. Additionally, a learning cycle is incorporated to update a battery model of the battery with certain parameters. The battery model is updated by introducing a time-varying current to the battery and analyzing the voltage response of the battery. A model-based predictive algorithm is used in combination with the battery model to predict battery output parameters based on variables derived from the learning cycle and additional inputs supplied to the model-based predictive algorithm. After one or more iterations, or using a simplified model-based equation, the model-based predictive algorithm can provide an accurate prediction for the maximum current that the battery can supply for a predetermined period of time.

19 Claims, 12 Drawing Sheets

(56) References Cited

U.S. PATENT DOCUMENTS

| | | | |
|---|---|---|---|
| 2005/0110498 A1* | 5/2005 | Plett | G01R 31/3648 324/433 |
| 2012/0101674 A1* | 4/2012 | Wang | G01R 31/3651 701/22 |
| 2013/0009607 A1* | 1/2013 | Nishibayashi | B60L 11/1844 320/162 |
| 2013/0082640 A1* | 4/2013 | Nishibayashi | H02J 3/32 320/106 |
| 2013/0082641 A1* | 4/2013 | Nishibayashi | H02J 3/32 320/106 |
| 2013/0103333 A1* | 4/2013 | Nishida | H01M 10/482 702/63 |
| 2013/0119921 A1* | 5/2013 | Choe | H02J 7/007 320/106 |

* cited by examiner

METHODS AND APPARATUS FOR BATTERY POWER AND ENERGY AVAILABILITY PREDICTION

CROSS-REFERENCE TO RELATED APPLICATIONS

The present application claims the benefit of U.S. Provisional Application No. 61/988,823, entitled "METHODS AND APPARATUS FOR BATTERY POWER AND ENERGY AVAILABILITY PREDICTION" filed May 5, 2014, and U.S. Provisional Application No. 62/009,855, entitled "METHODS AND APPARATUS FOR BATTERY POWER AND ENERGY AVAILABILITY PREDICTION" filed Jun. 9, 2014, the contents of which are incorporated herein by reference in their entirety for all purposes.

FIELD

The described embodiments relate generally to predicting power and energy availability for a battery. More particularly, the present embodiments relate to a model-based prediction algorithm for predicting power and energy availability for a battery.

BACKGROUND

Developing a battery with a longer battery life has been a major focus of much research and development since the inception of mobile computing devices into consumer markets. Many of the processes occurring within a mobile device necessitate large power stores to be available over an extended period of time. Moreover, consumer lifestyles in many respects have moved towards a more mobile society where a user of a mobile device may constantly be expecting to travel. As a result, the user may be limited by the lack of available of time and places to recharge their mobile device. Given the importance of power to the mobile device, it is imperative that a battery be optimized to require less recharging over the lifetime of the mobile device. Although many mobile devices contain an indicator for remaining charge of a device battery, often times the indicator can be inaccurate. If the indicated remaining charge of a battery is estimated incorrectly, the mobile device may undergo shut-down procedures at a time when there is actually enough charge left to power a device for an extended period of time. Additionally, if a user incorrectly presumes that a battery is nearly without charge, the user may focus on finding a place to recharge the battery at a time when they may actually have a reasonable amount of charge left to complete whatever function the user was employing the device to perform. Therefore, despite many attempts to advance battery life, battery technology may be impeded by less adaptive mobile devices that fail to account for the many physical variables of batteries.

Many mobile device designers have focused on creating mobile devices that will consume less power rather than improving battery technology. Although these attempts can be fruitful for some designs, providing less power to the mobile device can diminish the processing capabilities of the mobile device resulting in a nearly trivial improvement to the mobile device. Moreover, such attempts to improve battery life focus less on the battery and more on the operations of the mobile device. Unfortunately, many battery monitoring systems for mobile devices fail to analyze many variables related to the environment and conditions in which the battery is operating, thereby limiting the adaptive capabilities of the mobile device.

SUMMARY

This paper describes various embodiments that relate to methods and apparatus for predicting power and energy availability of a battery. In some embodiments, a computer-implemented method is set forth for generating an estimate for a maximum current output that a battery can supply to a device. The computer-implemented method can include providing a time-varying current to the battery and updating a battery model based on a voltage response of the battery to the time-varying current. The method can further include receiving a time input, wherein the time input is a desired amount of time the maximum current output can be provided by the battery. Additionally, the method can include determining, based the battery model and time input, a final voltage corresponding to the maximum current output, and calculating the estimated maximum current output of the battery based on the final voltage.

In other embodiments, a machine-readable non-transitory storage medium is set forth. The storage medium can store instructions that, when executed by a processor included in a computing device, cause the computing device to carry out steps that include causing a battery of the computing device to provide a discharge current and sampling a voltage response of the battery when the battery is providing the discharge current. The steps can further include determining, based on the voltage response of the battery, a transfer resistance and a capacitance value for a battery model equation. Additionally, the steps can include calculating, based on the battery model equation and a time input, an estimated final voltage for the battery, wherein the time input corresponds to a desired amount of time an estimated maximum current can be output from the battery and the estimated final voltage is an estimated voltage of the battery at an end of the desired amount of time. Furthermore, the steps can include calculating a voltage difference between the estimated final voltage and a cut off voltage corresponding to a minimum voltage desired for the estimated maximum current. Finally, the method includes, when the voltage difference is less than a predetermined error, generating an estimated maximum current value.

In yet other embodiments, a computing device is set forth. The computing device can include a battery, a processor, and a memory. The memory can store instructions that when executed by the processor cause the computing device to perform steps that include causing the battery to output a discharge current characterized by current characteristic parameters including an initial current value, maximum current value, and discharge period. The steps can further include calculating battery characteristic parameters including an open circuit voltage and a capacitance value based on a voltage response exhibited by the battery when the battery is providing the discharge current. Additionally, the steps can include solving, using the current characteristic parameters and battery characteristic parameters, a model circuit equation for the battery, and deriving an estimate for a maximum current output of the battery based on the model circuit equation.

Other aspects and advantages of the invention will become apparent from the following detailed description taken in conjunction with the accompanying drawings which illustrate, by way of example, the principles of the described embodiments.

BRIEF DESCRIPTION OF THE DRAWINGS

The disclosure will be readily understood by the following detailed description in conjunction with the accompanying drawings, wherein like reference numerals designate like structural elements.

DETAILED DESCRIPTION

Figure 1:
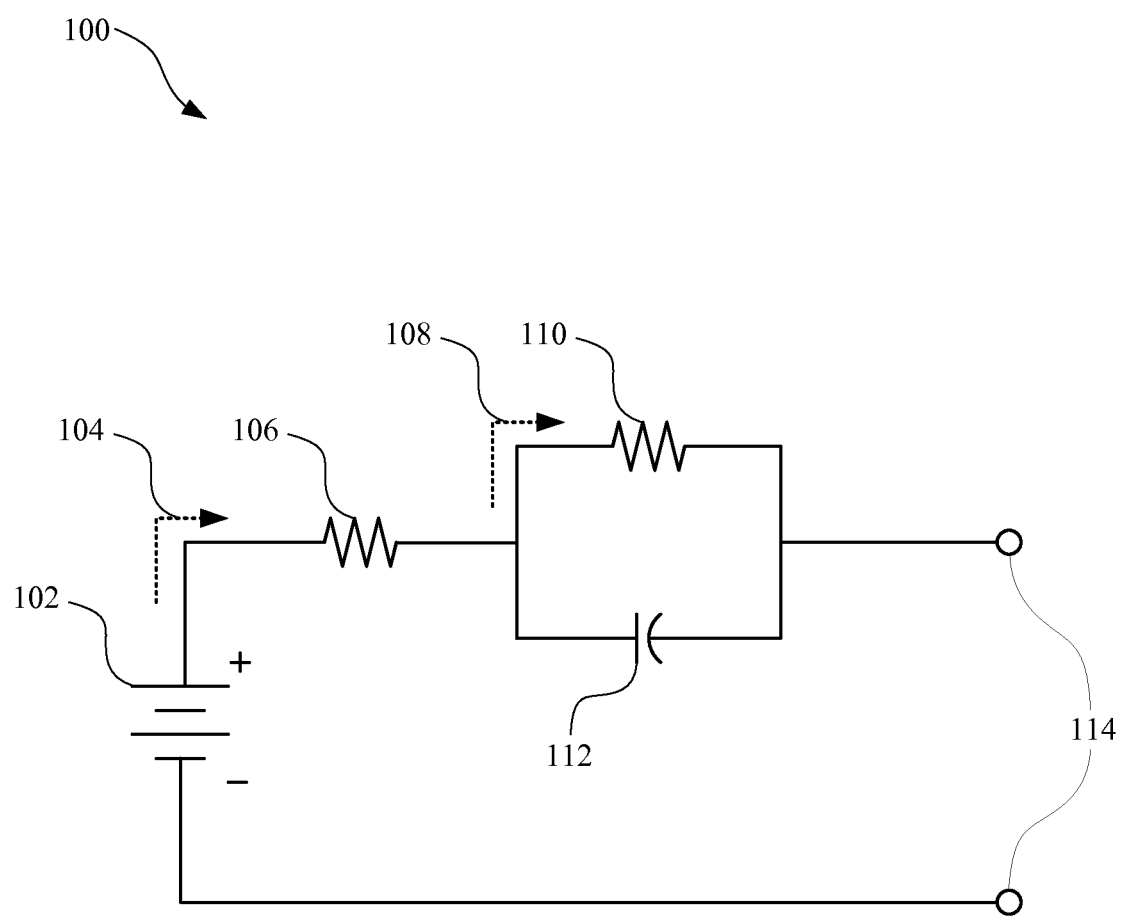
FIG. 1 illustrates a schematic for an equivalent model circuit according to some embodiments discussed herein.

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

As consumers become increasingly more mobile, the demand for devices with longer battery lives has increased. In some respects, battery technology has changed to incorporate new materials designed to increase power storage of batteries. Other improvements have focused on the use of lower powered devices that have longer running times by consuming less energy. In some designs, certain characteristics of a battery are stored and used to determine performance parameters for a mobile device based on the characteristics. However, these designs can be inadequate because the designs do not account for real-time changes to battery operation or adjustments in the environment that might affect battery performance. The embodiments discussed herein are set forth to resolve these deficiencies.

The embodiments relate to methods and apparatus for predicting the maximum current, power, and/or energy that a battery can provide to a particular device or system during a given period of battery operation. The prediction can be made based on a battery model whose parameters are derived during a learning cycle set forth herein. The learning cycle uses a curve fitting operation with battery response data to derive the parameters of the battery model. Thereafter, using the battery model, iterations of a predictive algorithm are performed to determine the maximum current output the battery can provide for a given amount of time.

The learning cycle is a process for updating the parameters of the battery model. The battery model has fixed components that are each associated with parameters derived by the learning cycle. The parameters are derived by introducing a time-varying current to the battery and analyzing the voltage response of the battery or vice versa. Data is collected from the voltage responses and a curve fitting operation is used to find any temperature and/or state of charge dependencies of the parameters of the battery model. The parameters can include variables characterized by conditions internal to the battery, as well as a variety of variables external to the battery including environmental variables. In particular a resistive value for the battery, which can be obtained from the curve fitting, is at least partially indicative of the age of the battery. Another parameter can include a capacitance value, which can be representative of the transient characteristics of the battery. Once the parameters are determined, the battery model can be updated with the parameters accordingly.

A model-based predictive algorithm is used to predict battery output based on the updated battery model and other inputs to the predictive algorithm. The predictive algorithm uses a transport current calculated from the battery model, the state of charge, an estimated maximum current, and a maximum operating time to predict an estimated final voltage for the battery at the end of the maximum operating time. The estimated final voltage is subsequently compared to a cutoff voltage, which can be a minimum voltage for the battery to supply power during the maximum operating time. A voltage difference is then taken between the cutoff voltage and the estimated final voltage. If the voltage difference is less than a predetermined error value, the value for the estimated maximum current is supplied to the device being powered by the battery. In this way, the device can determine the maximum amount of power and/or energy that can be supplied to the device over a certain period of time. If the voltage difference is greater than a predetermined error value, another iteration of the predictive algorithm is performed using an updated estimated maximum current value. The updated estimated maximum current value can be derived from the voltage difference and the previous estimated maximum current input(s) through any suitable numerical method of approximation. In some embodiments, after one or more iterations of the predictive algorithm, the voltage difference can converge to the predetermined error value. This ensures that the battery can provide the estimated maximum current value for a particular iteration, at a voltage equal to or greater than the cutoff voltage, and over the maximum operating time provided to the predictive algorithm.

These and other embodiments are discussed below with reference to FIGS. 1, 2, 3, 4, 5, 6, 7, 8A, 8B, 9, 10, 11 & 12; however, those skilled in the art will readily appreciate that the detailed description given herein with respect to these figures is for explanatory purposes only and should not be construed as limiting.

FIG. 1 illustrates a schematic for a resistor-capacitor (RC) model circuit 100, also referred to as an equivalent model circuit or a battery model herein. Specifically, FIG. 1 sets forth an RC model circuit 100 that can be used to model a battery. The RC model circuit 100 can be used in a learning cycle, as discussed herein, in order to update or otherwise provide parameters for the RC model circuit 100. The learning cycle is in part executed by analyzing the transient voltage response, or current response, of a battery to pulsed currents or voltages, and/or any other suitable time varying signals. The model representation of FIG. 1 sets forth a representation of an open circuit voltage 102 of the battery and series resistance 106 of the battery. A discharge current 104 represents current leaving the battery during the learning cycle, as discussed herein. A charge transfer resistance 110 is provided to represent a resistance value that is calculated as a result of a curve fitting operating of the learning cycle. A transport current 108 is a current across the charge transfer resistance 110 as a result of the discharge current 104 from the battery. Additionally, a double-layer capacitor 112 is provided to represent the transient characteristics of the battery. The capacitance value for the double-layer capacitor 112 can be derived from the curve fitting operation of the learning cycle, as discussed herein. The terminal voltage 114 is a voltage measurement of the RC model circuit 100.

The learning cycle is a process for deriving the parameters for the RC model circuit 100. During the learning cycle, the battery modeled by the RC model circuit 100 is allowed to discharge at a predetermined current value and receive a series of pulsed currents or voltages. At the beginning of the learning cycle, the battery can be fully charged. Thereafter, the battery can be discharged at a predetermined amount of current during a closed circuit discharge, followed by an introduction of current pulses, which can occur at a predetermined frequency. In some embodiments, a predetermined number of total pulses are generated over a definite period. A combination of current responses during the closed circuit discharge of the battery and current responses during the introduction of current pulses can each be sampled at predetermined sampling rates that can be equal or different values depending on the application or embodiment. The various pulse and sampling parameters can be modified and arranged in any suitable arrangement in order to learn various parameters governing the performance of a particular battery. The response of the battery to the pulsed currents or voltages is thereafter determined and analyzed. A particular response of interest is how the open circuit voltage 102 of the battery changes with the state of charge (SOC). Based on this determination, the results of the learning cycle can be used to determine a relationship between SOC and parameters of the RC model circuit 100 by solving a set of equations included herein. In particular, values for the transfer resistance 110 and capacitance for the double-layer capacitor can be determined by solving the set of equations.

The learning cycle can apply data from the sampled battery responses to the set of equations below in order to derive the variables SOC ("z") and transport current 108 ("$i_2$") for later use by a prediction algorithm. The set of equations (1) and (2) are immediately set forth below. In equation (1), the capacitance of the modeled double-layer capacitor 112 is represented by "C" and the resistance of the charge transfer resistance 110 is represented by "$R_c$." The constant for coulombs is represented by Q and the discharge current 104 of the battery is represented by "I." In equation (2), terminal voltage 114 is represented by "y," a series resistance 106 of the battery is represented by "$R_s$," and open circuit voltage (OCV) 102 is represented by "OCV(z)," thereby illustrating the dependence of the OCV on the SOC. The equations (1) and (2) are as follows:

$$\frac{d}{dt}\begin{bmatrix} i_2 \\ z \end{bmatrix} = \begin{bmatrix} -\frac{1}{R_C * C} & 0 \\ 0 & 0 \end{bmatrix} \cdot \begin{bmatrix} i_2 \\ z \end{bmatrix} + \begin{bmatrix} \frac{1}{R_C * C} \\ \frac{1}{Q} \end{bmatrix} \cdot I \quad (1)$$

$$y = OCV(z) - I \cdot R_S - i_2 \cdot R_C \quad (2)$$

The parameters of the equations (1) and (2) can be derived by curve fitting the sampled data from the battery responses with different SOC values and thereafter deriving a relationship between the $R_c$ and C values, and the SOC values over time. The equations (1) and (2) can be solved through any suitable method of numerical analysis. The transport current 108 and SOC can thereafter be provided as some of the variables to be input into the prediction algorithm shown in FIG. 2. Other inputs can include static or dynamic inputs such as battery temperature, the type of device the battery is connected to, the type and/or strength of network connection for the device, screen brightness, the number of applications running on the device, any future predicted activity on the device, and/or any other suitable parameters that affect battery life. For example, the temperature of the battery can be measured by a temperature sensor before, during, and/or after the current pulses are received by the battery. The changes in temperature can be analyzed and used to derive one or more static or dynamic inputs for the model-based prediction algorithm of FIG. 2.

Figure 2:
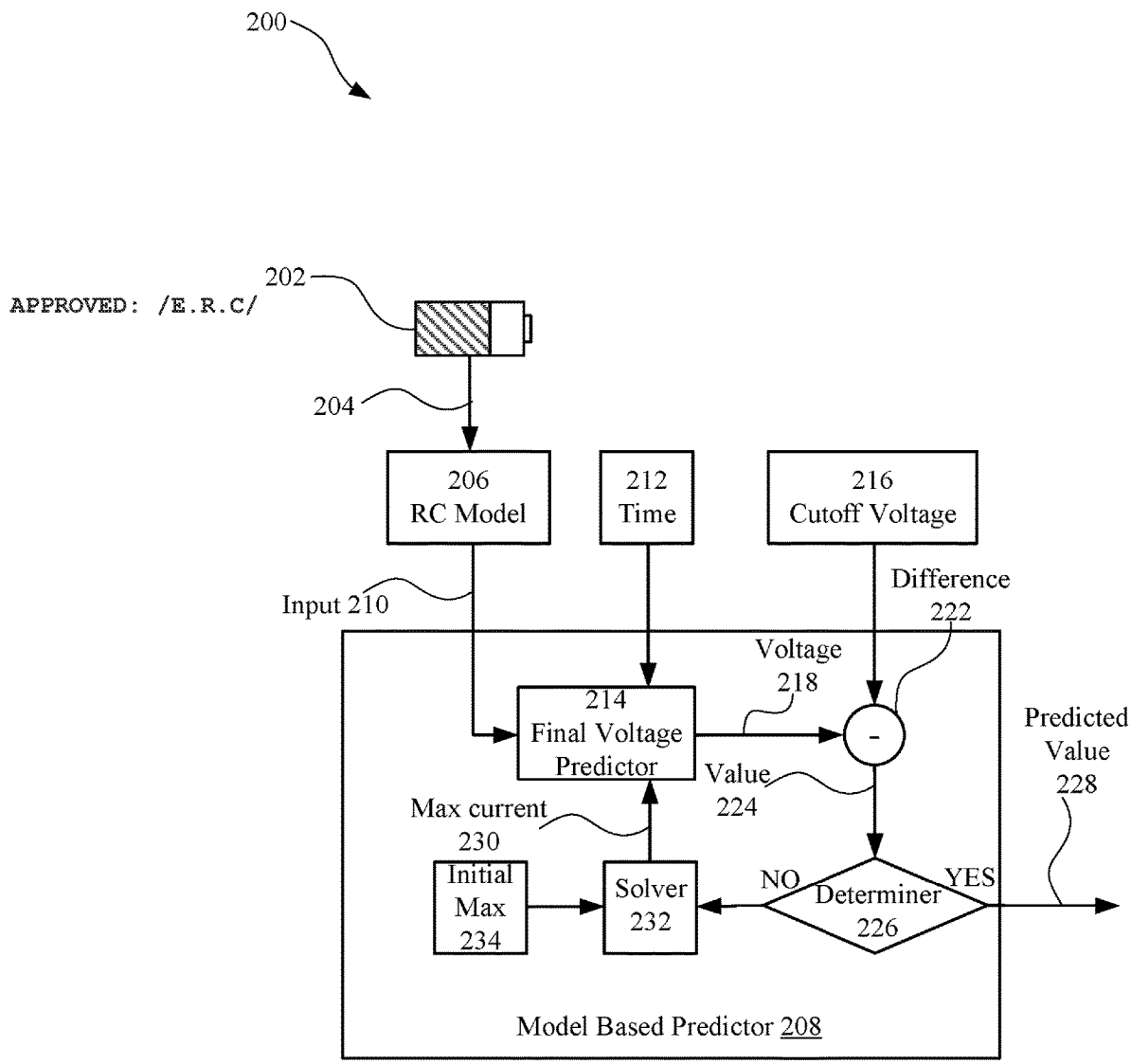
FIG. 2 illustrates a schematic for a model-based prediction algorithm according to some embodiments discussed herein.

FIG. 2 illustrates a schematic 200 for a model prediction algorithm. Specifically, FIG. 2 sets forth a maximum current prediction algorithm for a battery, which can be used to predict a maximum current, power, and/or energy output for a battery at a given time. The schematic 200 shows a battery 202 providing discharge current 204 to an RC model 206 in order to derive an SOC and transport current 108, as discussed herein and with respect to FIG. 1. It should be noted that the RC model 206 is the RC model circuit 100 from FIG. 1. The SOC and transport current 108 are included in the input 210 of the model-based predictor 208. Additionally, the model-based predictor is supplied a maximum operating time 212, which represents a desired period of time that a maximum current can be supplied from the battery 202. The maximum operating time 212 can be any suitable time that may be desired for predicting battery use, such as 1 second, 10 seconds, 1 minute, an hour, etc. For example, in some embodiments the period of time can be indicative of the remaining processing time for a function occurring on a device or a predicted amount of time before the next recharging of the battery 202 will occur. In this way, a device can make more accurate decisions regarding processing by receiving more accurate predictions of battery performance over the life time of the battery 202.

The final voltage predictor 214 can make predictions based on the updated RC model circuit 100. The final voltage predictor 214 can be provided the input 210 (including the values for SOC and transport current 108), the maximum operating time 212, and a maximum current value 230. The final voltage predictor 214 can thereafter derive a prediction of final voltage 218 of the battery 202 based on the SOC, transport current 108, the maximum operating time 212 provided, and a maximum current value 230. The maximum current value 230 is derived from a maximum current solver 232. Initially, the maximum current solver 232 receives an initial maximum current value 234 at a first iteration of the model-based predictor 208. During subsequent iterations, the maximum current solver 232 incorporates the prediction of final voltage 218 in order to derive an updated maximum current value 230 to be used by the model-based predictor 208. A desired cutoff voltage 216 is also provided as an input to the model-based predictor 208 to represent the minimum voltage that the battery 202 is to be operating by the end of the maximum operating time 212. The desired cutoff voltage 216 is compared to the predicted final voltage 218 by taking a difference of the two values at a differential operation 222. A difference value 224 between the desired cutoff voltage 216 and the predicted final voltage 218 is sent to an error determiner 226 to compare the difference value 224 to a predetermined error value. Specifically, a determination is made as to whether an absolute value of the difference value 224 is less than the predetermined error value. If the absolute value of the difference value 224 is less than the predetermined error value, a predicted value 228 of maximum current value 230 is output from the model-based predictor 208. If the absolute value of the difference value 224 is equal to or greater than the predetermined error value, the model-based predictor 208 reverts to the maximum current solver 232. At the maximum current solver 232, the maximum current value 230 being input into the final voltage predictor is modified based on the difference value 224 and the previous maximum current input(s). Using the updated maximum current value 230, the input 210, and the maximum operating time 212, the model-based predictor can perform additional iterations until the predetermined error value converges to a value equal to or less than the predetermined error value, and the predicted value of maximum current value 230 is output from the model-based predictor 208.

Figure 3:
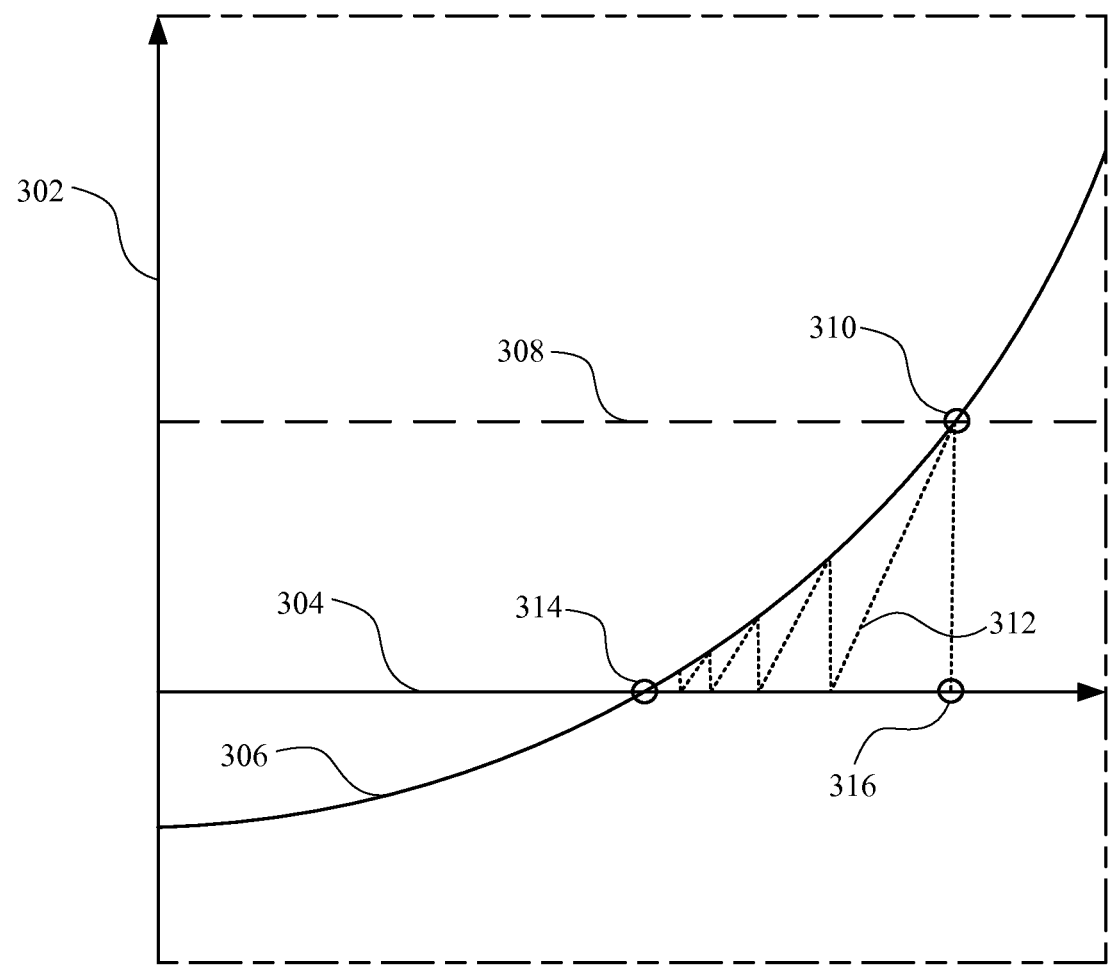
FIG. 3 illustrates a plot of voltage error versus maximum current according to some embodiments discussed herein.

FIG. 3 illustrates plot of voltage difference 302 versus estimated maximum current 304. Specifically, FIG. 3 sets forth how the model-based predictor 208 performs iterations in order to derive an estimated maximum current 304 that corresponds to a voltage difference 302 that is less than or equal to a predetermined error, according to some embodiments. For example, during a first iteration, a first maximum current value 316 can cause the error trend line 306 to have a positive error value 308. The positive error value 308 intersects the error trend line 306 at point 310, where a tangent line 312 can be derived. The tangent line 312 can be derived from a linear approximation, derivative method, or any other suitable numerical analysis method. Moreover, the tangent line 312 can have a slope that is a ratio of the voltage difference 302 and a current difference, wherein the current difference is a difference between a current estimated maximum current and a previously estimated maximum current, or vice versa. Using the tangent line 312, updated maximum current values 316 can be derived for subsequent iterations until the error trend line 306 converges to the predetermined error value 314 or any other suitable voltage difference 302, as discussed herein.

Figure 4:
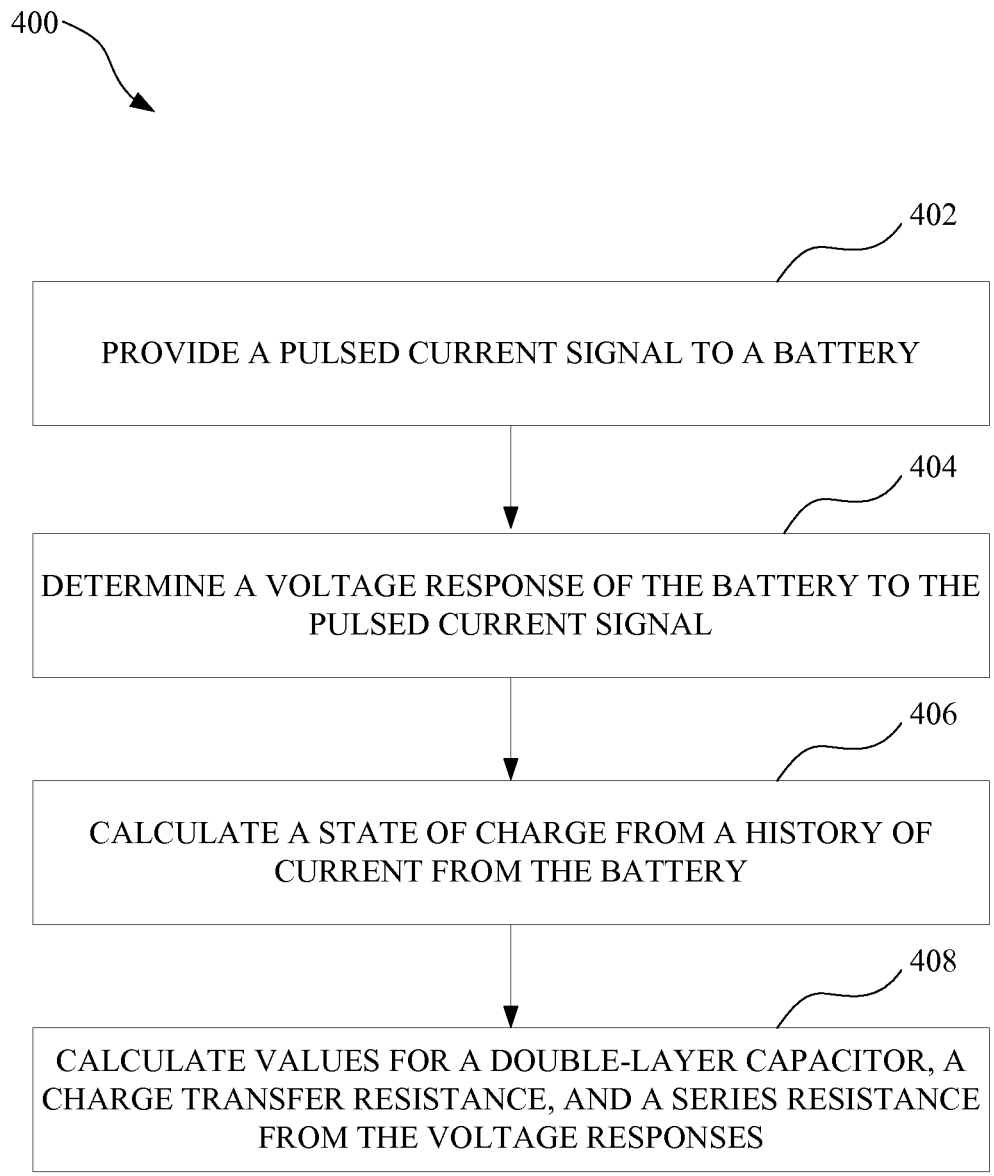
FIG. 4 illustrates a method for performing a learning cycle for a battery model according to some embodiments discussed herein.

FIG. 4 illustrates a method 400 for performing a learning cycle for a battery model. Specifically, FIG. 4 sets forth a method 400 for deriving certain parameters of the battery model using the voltage response of a battery. The method 400 can include a step 402 providing a pulsed current to a battery. At step 404, a voltage response of the battery to the pulsed signal is calculated. The pulsed signal can be pulses lasting a few seconds, and can occur every 30 minutes in some embodiments. The length of pulses and periods between pulses can be modified for any suitable learning cycle. Additionally, in some embodiments, a voltage response of the battery can be determined prior to the input of current pulses, and thereafter the current pulses can be input to determine a subsequent voltage response of the battery to the current pulses. The method 400 can additionally include a step 406 of calculating a state of charge from a history of current from the battery. Furthermore, the method 400 can include a step 408 of calculating model values for capacitance of a double-layer capacitor, a charge transfer current, and a series resistance from the voltage responses of the battery.

Figure 5:
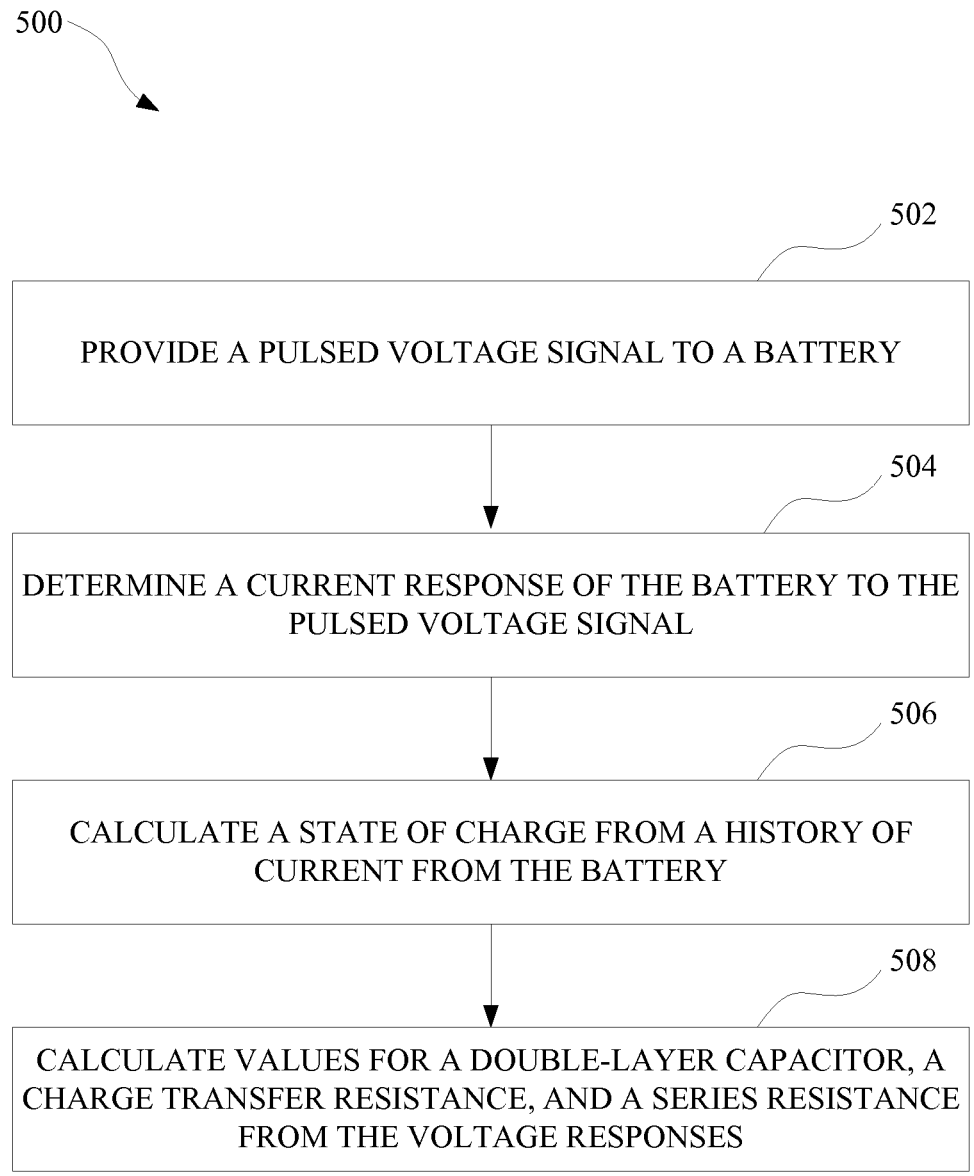
FIG. 5 illustrates a method for performing a learning cycle for a battery model according to some embodiments discussed herein.

FIG. 5 illustrates a method 500 for performing a learning cycle for a battery model. Specifically, FIG. 5 sets forth a method 500 for deriving certain parameters of the battery model using a current response of the battery. The method 500 can include a step 502 of providing a pulsed voltage signal to a battery. At step 504, a current response of the battery to the pulsed voltage signals is calculated. The pulsed voltage signals can be pulses lasting a few seconds, and can occur every for a predetermined period (e.g., every 30 minutes). The length of pulses and periods between pulses can be modified for any suitable learning cycle. Additionally, in some embodiments, a current response of the battery can be determined prior to the input of pulsed voltage signal, and thereafter the pulsed voltage signal can be input to determine the current response of the battery to the pulsed voltage signal. The method 500 can additionally include a step 506 of calculating a state of charge from a history of current from the battery. Furthermore, the method can include a step 508 of calculating values for a double-layer capacitor, a charge transfer current, and a series resistance from voltage responses of the battery.

Figure 6:
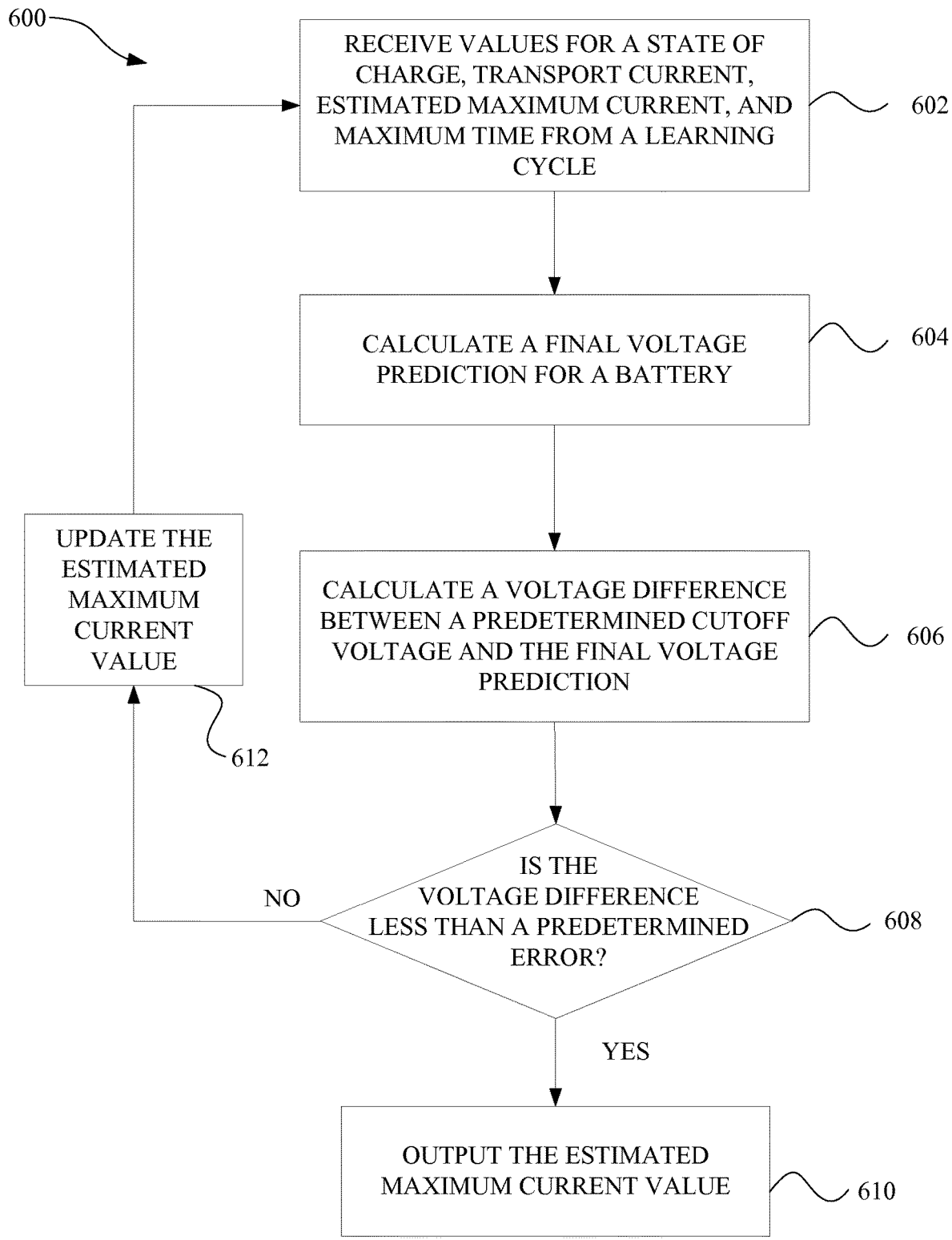
FIG. 6 illustrates a method for performing a model-based prediction algorithm according to some embodiments discussed herein.

FIG. 6 illustrates a method 600 for performing a model-based prediction algorithm using a battery model set forth herein. Prior to beginning the method 600, the battery model is updated according to some embodiments discussed herein (e.g., FIG. 4). The method includes a step 602 of receiving values for a state of charge, transport current, estimated maximum current, and maximum operating time from a prior learning cycle. The state of charge refers to the amount of charge remaining in a battery of a particular computing device in which the model-based algorithm has been configured to improve. The transport current is a value of current traveling across a charger transfer resistance of the battery model. The maximum current can be a maximum current that the battery can supply at a given state of charge. For example, in some embodiments, at maximum state of charge the battery can supply approximately 2.0 amperes or 3.0 amperes. The maximum operating time can refer to the maximum amount of time the battery is needed to supply a particular amount of current, power, or energy.

The method 600 can further include a step 604 of calculating a final voltage prediction for the battery based on the values provided at step 602 and the battery model. Subsequently, at step 606 a voltage difference between a predetermined cutoff voltage and the final voltage prediction are calculated. The absolute value of the voltage difference is thereafter used in step 608 where it is determined whether the voltage difference is less than a predetermined error. The predetermined error refers to a tolerance that can be established prior to the iterations of the model-based prediction algorithm in order to ensure that power can be provided for the full duration of the maximum operating time. The predetermined error ensures this because if the final voltage prediction is less than the predetermined cutoff voltage to an extent beyond the error, the method 600 reverts to step 612. At step 612, an updated maximum current value is supplied back into step 602 and the updated maximum current value is thereafter used in step 604 to calculate a final voltage prediction for the battery. The updated maximum current value can be based on the voltage difference and differences between current values used in the previous iteration(s). The method 600 can continue until the step 608 determines that the calculated voltage difference is less than the predetermined error, at which point the maximum current value can be output at step 610. The maximum current value can then be used to determine the maximum power and/or energy that the battery can supply. These values are considered to be more accurate battery output predictions because of the use of transient voltage responses from the learning cycle.

In some embodiments, the maximum current value can be predicted using an estimated solution to equations (1) and (2) discussed herein. Specifically, the iterations for predicting and updating the maximum current value (e.g., step 612) can be eliminated thereby reducing the computational requirement for predicting the maximum current value. In order to approximate the equations (1) and (2) to derive suitable solutions, various assumptions can be made regarding the equations (1) and (2). An assumption that can be made is that any change to SOC is small or negligible during the current pulses for determining the various variables of the RC model circuit 100. The term OCV can be assumed to be unchanged during an $I_{max}$ current pulse thereby removing a dependent variable from the equations (1) and (2). Additionally, changes to the values for $R_c$ and C can also be ignored after the values for $R_c$ and C are determined from the learning cycle. The approximation for equations (1) and (2) can also be manifested by assuming that "$i_2$" of the RC model circuit 100 equals "I" when "I" is at $I_{max}$ and the double-layer capacitor 112 is fully charged. A simplified solution equation for equations (1) and (2) incorporating constant values for OCV, $R_c$, and C is set forth in equation (3). The variable $V_{cut}$ represents the lowest voltage value resulting from the pulsed current provided to the RC model circuit 100. The value $I_0$ represents the initial current from the battery measured before the maximum current value is predicted. Equation (4) provides an additional means for simplifying equation (3) when the value for pulse width "t" is much less than the value of $R_c*C$. Specifically, equation (4) allows the term $$e^{-\frac{t}{R_C \cdot C}}$$

to be replaced with $$1 - \frac{t}{R_C \cdot C}$$

when the pulse width "t" is much less than the value for $R_c*C$.

$$I_{max} = \frac{OCV - I_0 \cdot e^{-\frac{t}{(R_C \cdot C)}} \cdot R_C - V_{cut}}{R_S + R_C \cdot \left(1 - e^{-\frac{t}{R_C \cdot C}}\right)} \quad (3)$$

$$e^{-\frac{t}{R_C \cdot C}} \approx 1 - \frac{t}{R_C \cdot C} \quad \text{for } t \ll R_C \cdot C \quad (4)$$

Figure 7:
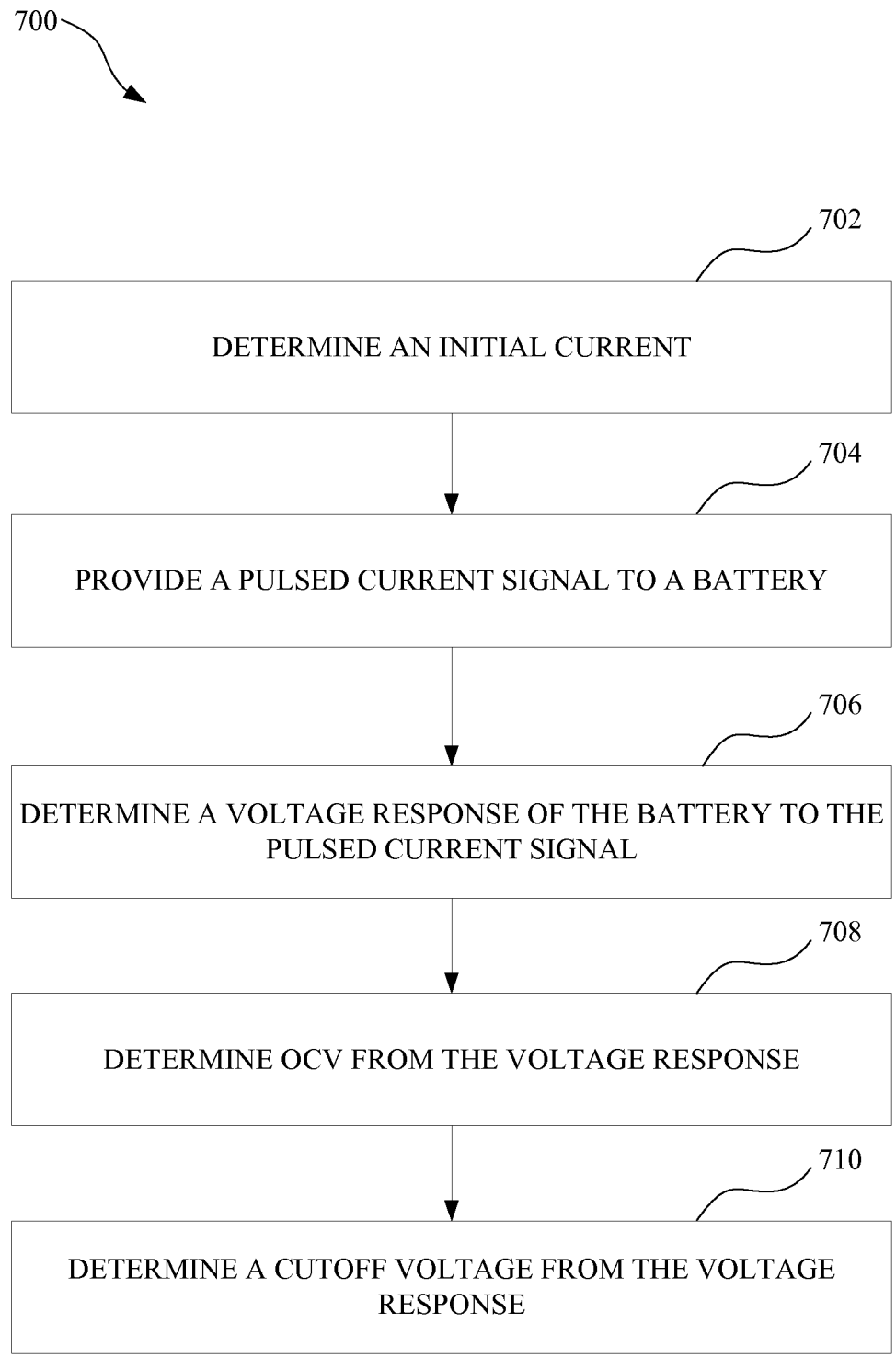
FIG. 7 illustrates a method for solving a simplified equation for the maximum current value, according to some embodiments discussed herein.

FIG. 7 illustrates a method 700 for solving a simplified model equation for the maximum current value, according to some embodiments discussed herein. The simplified model equation refers to equation (3), which can be supplied values for time "t" in order to predict a maximum current value $I_{max}$ after the learning cycle has completed, as discussed herein. At step 702, an initial current $I_0$, which is a current initially provided by the battery, is determined and measured before the maximum current value is predicted. At step 704, a pulsed current signal is provided to the battery. The pulsed current signal has a width of time value "t," which can be used as a variable in equation (3) to determine the voltage related variables of the simplified model equation (3). At step 706, a voltage response of the battery to the pulsed current signal is determined. At step 708, the OCV of the voltage response is measured by as the voltage response reaches a constant maximum value. At step 710, a cutoff voltage $V_{cut}$ is determined from the voltage response of the battery to the pulsed current signal. Thereafter, in order to use equation (3) to predict $I_{max}$ for an input time "t," equation (3) can be provided with the previously determined cutoff voltage $V_{cut}$, an initial current $I_0$ measured from the battery prior to a prediction, and the variables $R_s$, $R_c$, and C from the learning cycle. In this way, the predicted maximum current value $I_{max}$ can be predicted for any suitable input time t provided into equation (3) without performing iterations or storing multiple values that are depending upon SOC. Moreover, when t is much less than the value for $R_c*C$, the term $$e^{-\frac{t}{R_C \cdot C}}$$

can be replaced with $$1 - \frac{t}{R_C \cdot C}$$

to further simplify the calculation of the predicted maximum value for current $I_{max}$.

Figure 8A:
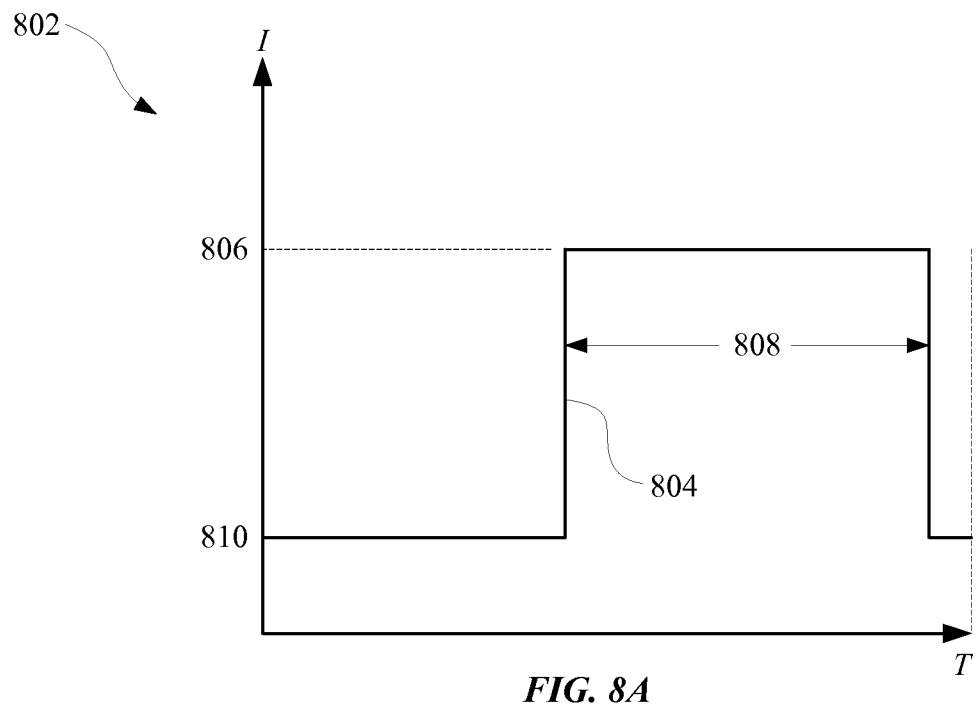
FIGS. 8A-8B illustrate plots of a current pulse introduced into the resistor-capacitor (RC) model circuit and the voltage response that is measured as a result.
Figure 8B:
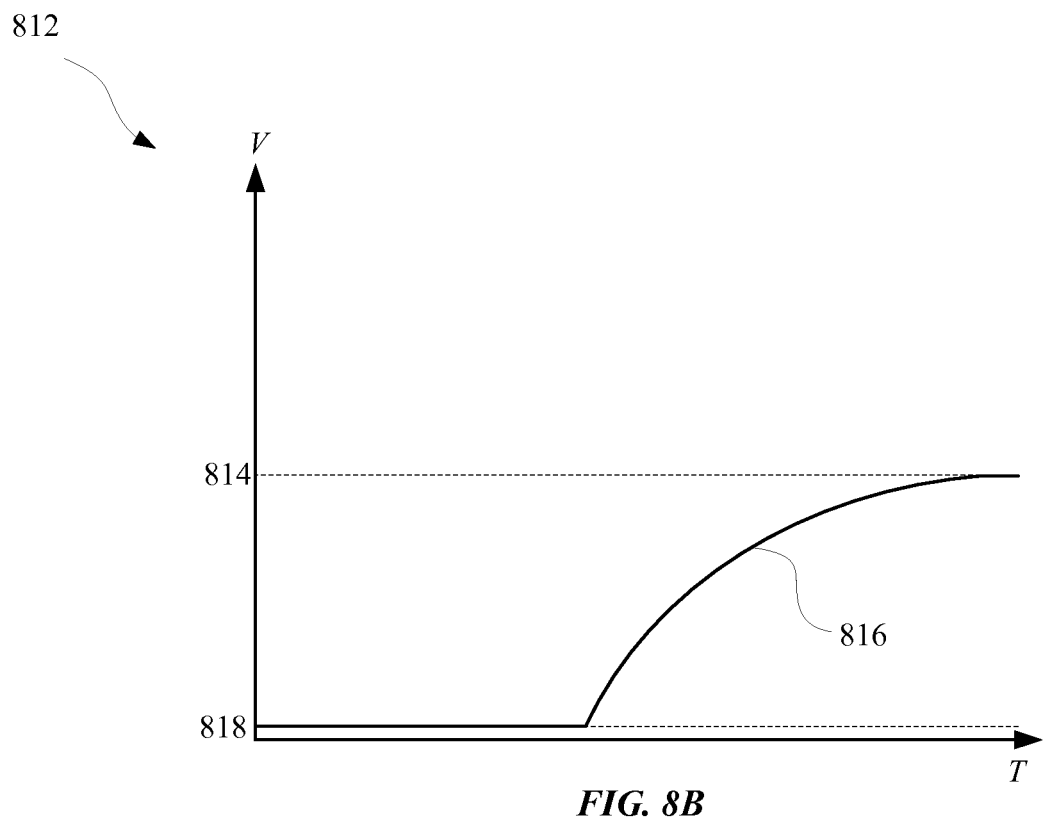

FIGS. 8A-8B illustrate plots of a current pulse introduced into the RC model circuit 100 and the voltage response that is measured as a result. Specifically, FIG. 8A illustrates plot 802 of current I versus time T, which sets forth the current pulse 804 that that can be input into the RC model circuit 100 in order to derive some of the variables for equation (3). The current pulse 804 can be applied to the RC model circuit 100 when the SOC will not be affected, thereby preventing the creation of non-linear variables. The current pulse 804 can have an initial current value 810, which is stored as $I_0$, and a final current value 806, which is stored as an initial maximum current, $I_{max}$. Additionally, the current pulse 804 can have a width of time 808 that corresponds to the time value "t" that can be used initially in equation (3) to solve for the various voltage related variables of equation (3) (e.g., 10 seconds or any other suitable time for a current pulse). FIG. 8B illustrates a plot 812 of voltage V versus time T, which shows the voltage response 816 of the RC model circuit 100 to the current pulse 804, according to some embodiments. Upon the RC model circuit 100 receiving the initial current value 810, the voltage can have an initial cutoff voltage 818, $V_{cut}$. Thereafter, as a result of the current pulse 804 being applied to the RC model circuit 100, the voltage response 816 is measured until the voltage approaches an OCV value 814. The OCV value 814 and cutoff voltage 818 are thereafter stored and used in equation (3) to predict $I_{max}$ for a given time input "t."

Figure 9:
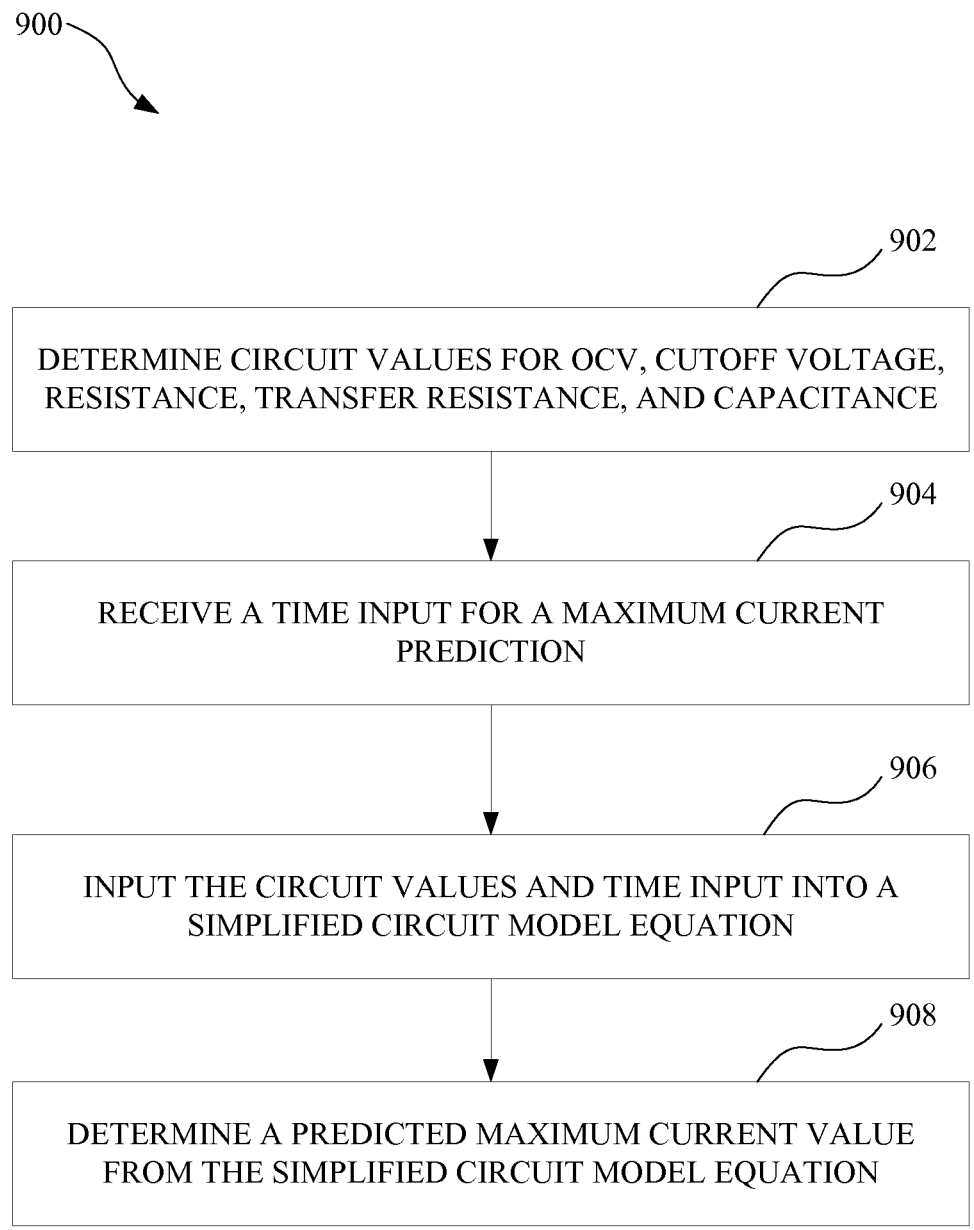
FIG. 9 illustrates a method for predicting a maximum current value according to the equations provided herein.
Figure 10:
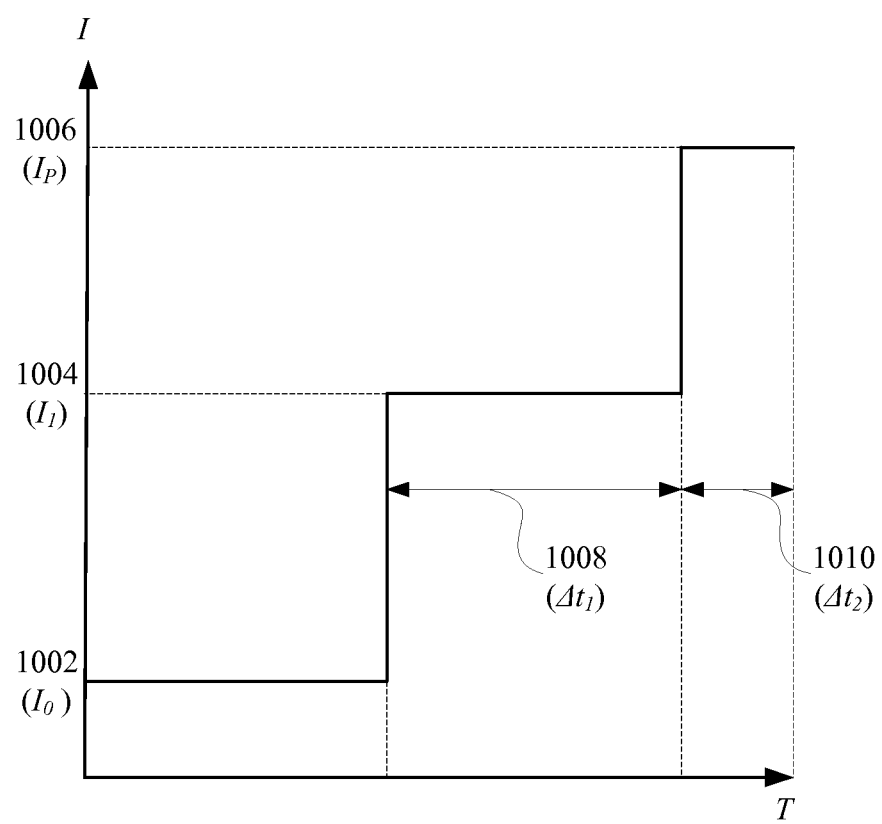
FIG. 10 illustrates a plot of multiple current pulses that can be used for estimating a maximum current output of a battery.

FIG. 9 illustrates a method 900 for predicting a maximum current value according to the equation (3), which is a simplified version of equation (1). At step 902, various circuit values for the equation (3) are determined, as discussed herein. Specifically, the circuit values for OCV, cutoff voltage $V_{cut}$, resistance $R_s$, and transfer resistance $R_c$, and capacitance C of the modeled double-layer capacitor 112. Thereafter, at step 904, a time input "t" is received for the maximum current prediction. The time input refers to the amount of time that the battery will be predicted to theoretically provide the predicted maximum current value $I_{max}$. At step 906, the circuit values and time input are provided into equation (3), also referred to as a simplified model circuit equation. Step 906 can optionally be modified by adding the additional step of replacing $$"e^{-\frac{t}{R_C \cdot C}}" \text{ with } "1 - \frac{t}{R_C \cdot C}"$$

in equation (3), as discussed herein, when the time input "t" is much less than the value for $R_c*C$. At step 908, a determination is made for the maximum predicted current value corresponding to the time input "t" by solving equation (3) for $I_{max}$. In this way, less processing power and memory is required to make accurate predictions for $I_{max}$.

In other embodiments, the maximum current can be estimated based on two separate discharge currents and discharge times in order to provide a more accurate prediction of battery life and avoid potential brownouts. This prediction is based on at least the two model equations detailed below, and can be readily understood in view of RC model circuit 100 of FIG. 1 and plot 1000 of FIG. 10. In order to derive a first model equation, equations (1) and (2) are solved in part based on a first time period 1008 ($\Delta t_1$) when a first discharge current 1004 ($I_1$) (e.g., discharge current 104 in FIG. 1) is provided by the battery (i.e., open circuit voltage 102), and a second time period 1010 ($\Delta t_2$) when a second discharge current or current pulse 1006 ($I_P$) is provided by the battery. Additionally, the following equations are used with equations (1) and (2) in order to produce the battery life prediction accordingly:

$$\frac{d}{dt}i_2 = -\frac{i_2}{\tau} + \frac{I}{\tau} \qquad (5)$$

$$I - i_2 = Ae^{-\frac{t}{\tau}} + B \qquad (6)$$

In order to solve equation (5) and (6) for $i_2$, A+B is assumed to equal $I_1-I_0$ where $i_2=I_0$ when t=0, and $i_2=I_1$ when t=∞. Additionally, $\tau=R_{ct}*C_{dl}$ (i.e., charge transfer resistance 110 during $\Delta t_1$ multiplied by capacitance for the double layer capacitor 112 during $\Delta t_1$), $I_0$ can be an initial current 1002, and $I_1$ can be the first discharge current. Based on these parameters, the first model equation is provided as follows:

$$i_2(\Delta t_1) = I_2\left(1 - e^{-\frac{\Delta t_1}{\tau}}\right) + I_0 e^{-\frac{\Delta t_1}{\tau}} \qquad (7)$$

Using equation (7), a second model equation is derived based on a second discharge current or a current pulse $I_P$ 1006 lasting for a period $\Delta t_2$. The second model equation is provided as follows:

$$I_P - i_{2P} = A_P e^{-\frac{t}{\tau_P}} + B_P \qquad (8)$$

In order to solve equation (8) for current pulse $I_P$ 1006, $i_{2P}$ is assumed to equal equation (7) for t=0, and $I_P=i_{2P}$ and B=0 when t=∞. Additionally, $\tau_P=R_{ct,P}*C_{ct,P}$ (i.e., charge transfer resistance 110 during $\Delta t_2$ multiplied by capacitance for the double layer capacitor 112 during $\Delta t_2$), and $I_P$ is the current pulse $I_P$ 1006 or second discharge current. Based on these parameters, the following equations are derived for $A_P$ and $i_{2P}$:

$$A_P = I_P - I_1\left(1 - e^{-\frac{\Delta t_1}{\tau}}\right) - I_0 e^{-\frac{\Delta t_1}{\tau}} \qquad (9)$$

$$i_{2P} = I_P - A_P e^{-\frac{t}{\tau_P}} \qquad (10)$$

In order to derive the terminal voltage 114 or cell voltage for the battery (i.e., the open circuit voltage 102) for $\Delta t_2$, equations (9) and (10) are substituted for $i_2$ in equation (1). As a result of the substitution, the cell voltage is as follows, where $R_{s,P}$ is the series resistance 106 of the battery (i.e., OCV 102) during the second discharge current:

$$V_{cell,P} = OCV - I_P * R_{s,p} - I_P * R_{ct,p}\left(1 - e^{-\frac{t}{\tau_P}}\right) - R_{ct,p} * \delta I, \qquad (11)$$

where $$\delta I = I_1\left(1 - e^{-\frac{\Delta t_1}{\tau}}\right) * e^{-\frac{t}{\tau_P}} + I_0 e^{-\frac{\Delta t_1}{\tau}} * e^{-\frac{t}{\tau_P}}$$

Finally, in order to find or estimate Imax during $\Delta t_2$, $V_{cell,P}$ is divided by the resistance for the model circuit, and $\Delta t_2$ is substituted for t as follows:

$$I_{max,P} = \frac{OCV - I_P * R_{s,p} - I_P * R_{ct,p}\left(1 - e^{-\frac{\Delta t_2}{\tau_P}}\right) - R_{ct,p} * \delta I}{R_{s,p} + R_{ct,p}\left(1 - e^{-\frac{\Delta t_2}{\tau_P}}\right)}, \qquad (12)$$

where $$\delta I = I_1\left(1 - e^{-\frac{\Delta t_1}{\tau}}\right) * e^{-\frac{\Delta t_2}{\tau_P}} + I_0 e^{-\frac{\Delta t_1}{\tau}} * e^{-\frac{\Delta t_2}{\tau_P}}$$

Values for $R_{s,p}$, $R_{ct,p}$, $\tau$, and $\tau_p$ can be substituted into equation (12) based on corresponding characteristics of the battery for each of the time periods $\Delta t_1$ and $\Delta t_2$ as discussed herein. Additionally, $\Delta t_1$, $I_1$, $\Delta t_2$, $I_0$, and $I_P$ can be substituted into the equation based on their values when conducting the procedure herein for evaluating $I_{max}$. It should be noted that each of the values $\Delta t_1$, $I_1$, $\Delta t_2$, $\Delta t_2$, and $I_P$ can be fixed or set by a user conducting the procedure for estimating $I_{max}$.

Figure 11:
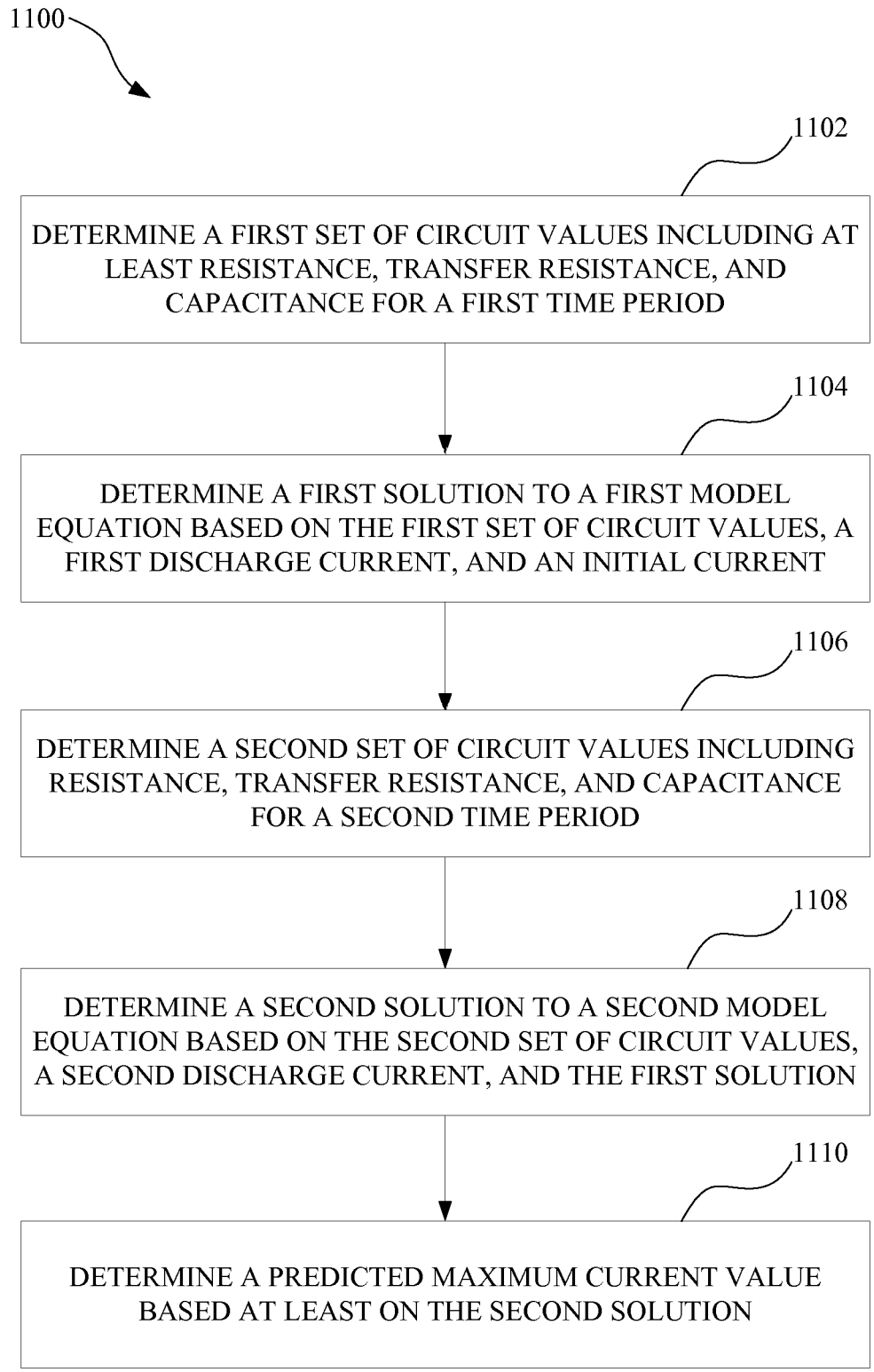
FIG. 11 illustrates a method for estimating the maximum current output of a battery using at least two model equations associated with an RC model circuit of the battery.

FIG. 11 illustrates a method 1100 for estimating a maximum current output of a battery using at least two model equations for an RC model circuit of the battery. The method 1100 can be performed by any suitable device, apparatus, or module. The method 1100 includes a step 1102 of determining a first set of circuit values not limited to OCV, series resistance, transfer resistance, and capacitance for the RC model circuit. Series resistance, transfer resistance, and the capacitance can be determined for a first time period and a first discharge current of the battery. At step 1104, a first solution to a first model equation is determined based on the first set of circuit values, the first time period, the first discharge current, and an initial current at the start of the first time period. The first model equation can include at least equation (7) as further discussed herein. Additionally, each of the first discharge current, initial current, and first time period can be set by a user and/or stored by a device performing method 1100. At step 1106, a second set of circuit values not limited to series resistance, transfer resistance, and capacitance are determined for the RC model circuit during a second time period. At step 1108, a second solution to a second model equation is determined based on the second set of circuit values, the second time period, the second discharge current, and the first solution determined at step 1104. The second model equation can include at least equation (8) as further discussed herein. In some embodiments, the second time period is greater than, less than, or equal to the first time period. Additionally, in some embodiments, the second discharge current is greater than, less than, or equal to the first discharge current and/or the initial current. At step 1110, a predicted maximum current value is determined based on the second solution. For example, the second solution can correspond to a solution to equation (8) as further discussed herein. Using equation (8), a cell voltage can be determined (e.g., see equation (10)) and ultimately a maximum current (e.g., see equation (12)) can be predicted for the battery based on the determined cell voltage and a resistance for the battery model as discussed herein.

Figure 12:
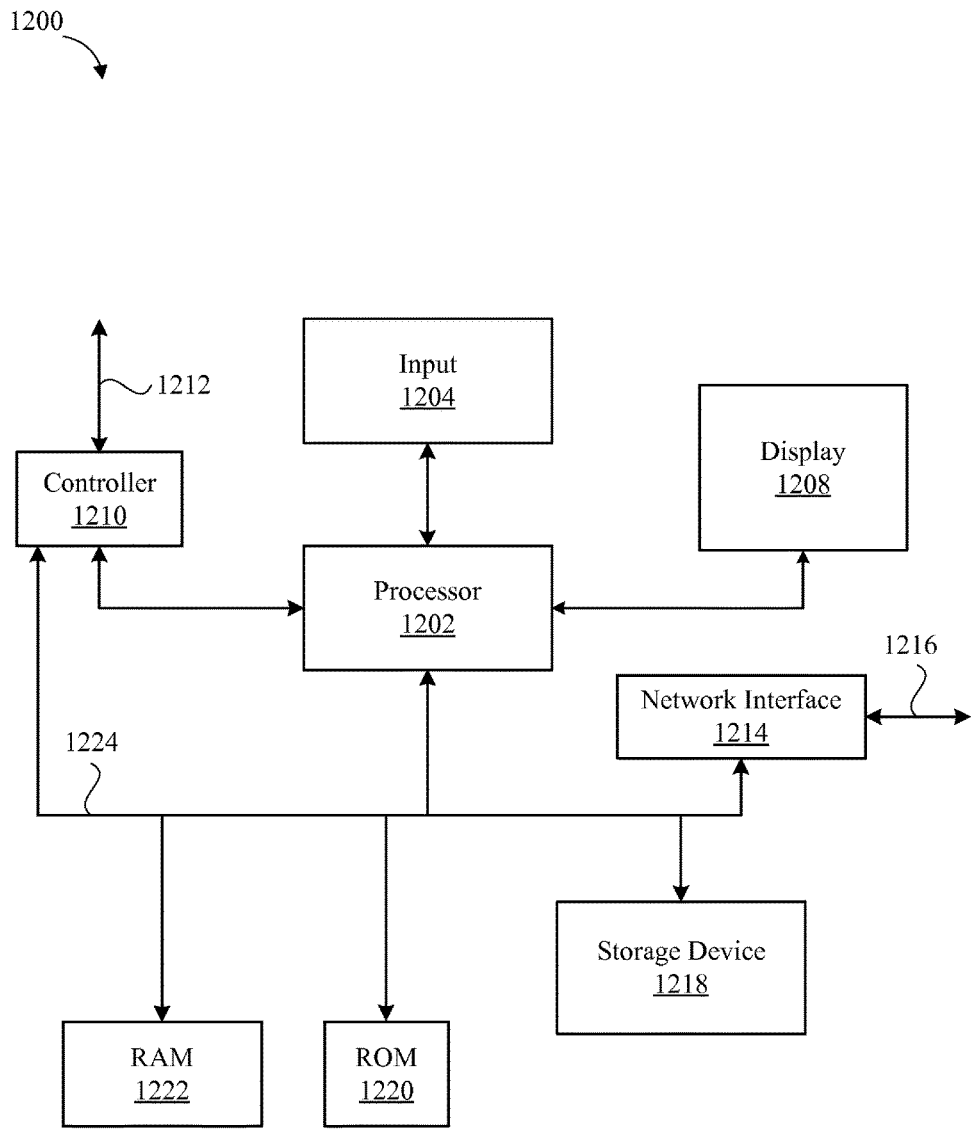
FIG. 12 is a block diagram of a computing device that can represent the components of a device or system configured to perform any of the embodiments discussed herein.

FIG. 12 is a block diagram of a computing device 1200 that can represent the components of a device or system configured to perform any of the embodiments discussed herein. It will be appreciated that the components, devices or elements illustrated in and described with respect to FIG. 12 may not be mandatory and thus some may be omitted in certain embodiments. The computing device 1200 can include a processor 1202 that represents a microprocessor, a coprocessor, circuitry and/or a controller for controlling the overall operation of computing device 1200. Although illustrated as a single processor, it can be appreciated that the processor 1202 can include a plurality of processors. The plurality of processors can be in operative communication with each other and can be collectively configured to perform one or more functionalities of the computing device 1200 as described herein. In some embodiments, the processor 1202 can be configured to execute instructions that can be stored at the computing device 1200 and/or that can be otherwise accessible to the processor 1202. As such, whether configured by hardware or by a combination of hardware and software, the processor 1202 can be capable of performing operations and actions in accordance with embodiments described herein.

The computing device 1200 can also include user input device 1204 that allows a user of the computing device 1200 to interact with the computing device 1200. For example, user input device 1204 can take a variety of forms, such as a button, keypad, dial, touch screen, audio input interface, visual/image capture input interface, input in the form of sensor data, etc. Still further, the computing device 1200 can include a display 1208 (screen display) that can be controlled by processor 1202 to display information to a user. Controller 1210 can be used to interface with and control different equipment through equipment control bus 1212. The computing device 1200 can also include a network/bus interface 1214 that couples to data link 1216. Data link 1216 can allow the computing device 1200 to couple to a host computer or to accessory devices. The data link 1216 can be provided over a wired connection or a wireless connection. In the case of a wireless connection, network/bus interface 1214 can include a wireless transceiver.

The computing device 1200 can also include a storage device 1218, which can have a single disk or a plurality of disks (e.g., hard drives) and a storage management module that manages one or more partitions (also referred to herein as "logical volumes") within the storage device 1218. In some embodiments, the storage device 1218 can include flash memory, semiconductor (solid state) memory or the like. Still further, the computing device 1200 can include Read-Only Memory (ROM) 1220 and Random Access Memory (RAM) 1222. The ROM 1220 can store programs, code, instructions, utilities or processes to be executed in a non-volatile manner. The RAM 1222 can provide volatile data storage, and store instructions related to components of the storage management module that are configured to carry out the various techniques described herein. The computing device 1200 can further include data bus 1224. Data bus 1224 can facilitate data and signal transfer between at least processor 1202, controller 1210, network interface 1214, storage device 1218, ROM 1220, and RAM 1222.

The various aspects, embodiments, implementations or features of the described embodiments can be used separately or in any combination. Various aspects of the described embodiments can be implemented by software, hardware or a combination of hardware and software. The computer readable medium is any data storage device that can store data which can thereafter be read by a computer system. Examples of the computer readable medium include read-only memory, random-access memory, CD-ROMs, HDDs, DVDs, magnetic tape, and optical data storage devices. The computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

What is claimed is:

1. A computer-implemented method for generating an estimate for a maximum current output that a battery can supply to a device, the computer-implemented method comprising:

providing a time-varying current to the battery;

updating a battery model based on a voltage response of the battery to the time-varying current, wherein updating the battery model includes generating a transfer resistance and a capacitance for the battery model;

receiving a time input, wherein the time input is a desired amount of time the maximum current output can be provided by the battery;

determining, based the battery model and the time input, a final voltage associated with the maximum current output;

calculating the estimate for the maximum current output of the battery based on the final voltage; and providing, from the battery to the device during the desired amount of time, an amount of current at least equal to the estimate for the maximum current output.

2. The computer-implemented method of claim 1, wherein calculating the estimate for the maximum current output includes calculating a difference between the final voltage and a cutoff voltage corresponding to a minimum voltage desired for the maximum current output.

3. The computer-implemented method of claim 2, wherein updating the battery model is repeated when the difference is equal to or greater than a predetermined error value.

4. The computer-implemented method of claim 1, wherein updating the battery model includes performing a curve-fitting operation to determine a transient characteristic of the battery.

5. The computer-implemented method of claim 1, wherein providing the time-varying current to the battery includes introducing current pulses to the battery according to a predetermined frequency.

6. A machine-readable non-transitory storage medium storing instructions that, when executed by a processor included in a computing device, cause the computing device to carry out steps that include:

causing a battery of the computing device to provide a discharge current;

sampling a voltage response of the battery when the battery is providing the discharge current;

determining, based on the voltage response of the battery, a transfer resistance and a capacitance value for a battery model equation;

calculating, based on the battery model equation and a time input, an estimated final voltage for the battery, wherein the time input corresponds to a desired amount of time an estimated maximum current can be output from the battery and the estimated final voltage is an estimated voltage of the battery at an end of the desired amount of time;

calculating a voltage difference between the estimated final voltage and a cut off voltage corresponding to a minimum voltage desired for the estimated maximum current;

when the voltage difference is less than a predetermined error, generating an estimated maximum current value; and during a time period equal to the desired amount of time, providing an amount of current equal to the estimated maximum current value to the computing device.

7. The machine-readable non-transitory storage medium of claim 6, wherein determining the transfer resistance and the capacitance value further includes tracking a change in a state of charge of the battery over time.

8. The machine-readable non-transitory storage medium of claim 6, wherein the steps further include:

measuring an open circuit voltage of the battery for use as a variable in the battery model equation.

9. The machine-readable non-transitory storage medium of claim 8, wherein the steps further include:

periodically updating the battery model equation based on the open circuit voltage.

10. The machine-readable non-transitory storage medium of claim 6, wherein the steps further include:

discharging the battery at an initial discharge current that is less than the discharge current; and sampling an initial voltage response of the battery during the discharging of the initial discharge current, wherein the estimated final voltage is based on the voltage response and the initial voltage response.

11. The machine-readable non-transitory storage medium of claim 6, wherein calculating the estimated final voltage is based on an initial estimate of maximum current.

12. The machine-readable non-transitory storage medium of claim 11, wherein the steps further include:

when the voltage difference is greater than or equal to the predetermined error, generating an updated final voltage based on a new estimate of maximum current.

13. A computing device, comprising:

a battery configured to output a discharge current;

a memory device coupled to the battery and arranged to store battery performance data including current characteristic parameters that characterize the discharge current based on an initial current value, a maximum current value, and a discharge period; and a processor coupled to the memory device and the battery, the processor configured to:

calculate battery characteristic parameters including an open circuit voltage, and a capacitance value based on a voltage response exhibited by the battery when the battery is outputting the discharge current, estimate a maximum current output of the battery using the current characteristic parameters and battery characteristic parameters; and during the discharge period, providing an amount of current equal to the estimated maximum current output.

14. The computing device of claim 13, wherein the discharge current is a pulsed current of a predetermined frequency.

15. The computing device of claim 13, wherein the battery characteristic parameters further include a transfer resistance.

16. The computing device of claim 13, wherein the steps further include:

causing the battery to provide an initial discharge current that is less than the discharge current; and calculating initial battery characteristic parameters exhibited by the battery when the battery is providing the initial discharge current.

17. The computing device of claim 16, wherein a model circuit equation is further used to estimate the maximum current output of the battery.

18. The computing device of claim 17, wherein the model circuit equation includes a time variable corresponding to the discharge period.

19. The computing device of claim 13, wherein the battery is discharged at two separate time periods and the estimate for the maximum current output is derived based on voltage responses exhibited by the battery during each of the two separate time periods.

* * * * *